United States Patent [19]
Thornton

[11] Patent Number: 5,994,952
[45] Date of Patent: Nov. 30, 1999

[54] NARROW BAND-PASS INTERFEROMETRIC FILTER HAVING ENHANCED OPERATIONAL CHARACTERISTICS

[75] Inventor: Barry Thornton, Austin, Tex.

[73] Assignee: INT Labs, Inc., Austin, Tex.

[21] Appl. No.: 08/955,480

[22] Filed: Oct. 22, 1997

Related U.S. Application Data

[63] Continuation-in-part of application No. 08/873,619, Jun. 12, 1997
[60] Provisional application No. 60/048,853, Jun. 6, 1997.

[51] Int. Cl.[6] ........................................ H03K 5/00
[52] U.S. Cl. .......................... 327/556; 327/552; 330/107; 330/306
[58] Field of Search .................................... 327/552, 557; 330/107, 109, 306

[56] References Cited

U.S. PATENT DOCUMENTS 4,984,292 1/1991 Millen ..................................... 327/557

FOREIGN PATENT DOCUMENTS 26 47 602 10/1976 Germany .

Primary Examiner—Dinh T. Le
Attorney, Agent, or Firm—Haynes and Boone, LLP

[57] ABSTRACT

A narrow band-pass interferometric filter for applying a response characteristic to an input signal to produce a filtered output signal. The filter is comprised of an inverting amplifier having an amplifying input to which the input signal is applied, an inverting input and an output. Coupled between the output and the inverting input of the inverting amplifier is an interferometric processing circuit which produces a signal having a generally constant positive amplitude except for a null at a pass frequency of the response characteristic for the filter. As the inversion of the signal produced by the signal processing circuit is the response characteristic of the filter and the amplitude thereof is greater than the amplitude of the input signal, the inverting amplifier passes the input signal whenever the frequency of the input signal matches the pass frequency of the filter. If, however, the frequency of the input signal is other than the pass frequency of the filter, the amplitude of the signal applied to the inverting input is greater than the amplitude of the input signal. Accordingly, the output of the inverting amplifier is driven to an inversion of the signal applied to the inverting input, The signal processing circuit may include a phase shift circuit which shifts the input signal by 180 degrees or a time delay circuit which delays the input signal by a time period generally equal to the period required for the input therealong.

15 Claims, 3 Drawing Sheets

5,994,952

1

NARROW BAND-PASS INTERFEROMETRIC FILTER HAVING ENHANCED OPERATIONAL CHARACTERISTICS

CROSS-REFERENCE TO RELATED PROVISIONAL APPLICATION

This application claims the benefit of U.S. Provisional Patent Application Ser. No. 60/048,853, filed on Jun. 6, 1997.

CROSS-REFERENCE TO RELATED APPLICATIONS

This application is a Continuation-in-Part of U.S. patent application Ser. No. 08/873,619, filed Jun. 12, 1997, assigned to the assignee of the present application and hereby incorporated by reference as if reproduced in its entirety.

This application is related to co-pending U.S. patent application Ser. No. 08/955,532 (Atty. Docket No. 10393.10), U.S. patent application Ser. No. 08/955,482 (Atty. Docket No. 10393.11), U.S. patent application Ser. No. 08/955,533 (Atty. Docket No. 10393.12), U.S. aatent application Ser. No. 08/956,244 (Atty. Docket No. 10393.19), all filed on even date herewith, assigned to the assignee of the present application and hereby incorporated by reference as if reproduced in their entireties.

TECHNICAL FIELD

The invention relates generally to band-pass filters and, more particularly, to a narrow band-pass filter characterized by reduced time delays when entering an active state thereof. The invention further relates to filters having an electrical network which utilizes interferometry to produce a response characteristic thereof.

BACKGROUND OF THE INVENTION

In its broadest sense, a filter encompasses any electrical network capable of selecting signals within a specified frequency range. One type of filter is commonly known as a "band-pass" filter. For such a filter, signals within a specified frequency band pass through the filter unattenuated while signals outside the specified frequency band are greatly attenuated. Like other types of filters, a band-pass filter may be configured to include only passive components such as resistors, capacitors and inductors or may alternately be configured to include active components such as transistors and integrated circuits. A specific class of filters, commonly referred to as "high Q-factor" or "high Q" filters, are particularly favored for narrow band-pass applications. The Q of a filter is the ratio of the reactance to the resistance of the electrical network which forms the filter and "high Q" filters refer to those filters in which the aforementioned ratio is on the order of about 1,000. High Q filters typically provide a response characteristic having very narrow pass bands, i.e., a response characteristic having on the order of about a 3 dB drop for a 5% shift off its resonant pass frequency.

A commonly recognized drawback to existing filter designs is the existence of a time delay between application of a signal to an input side of a filter in a rest state and entry of the filter into an active state whereby the filter's response characteristic is applied to the input signal. While the aforementioned time delay, which will hereafter be referred to as the "response delay" of a filter, will vary depending on the particular design of the filter, a typical response delay for

2 a filter may range between 100 $\mu$sec and 2 msec. As a result, therefore, filters often fail to detect input signals of relatively short duration, commonly known as "bursts", particularly when the duration of the burst is less than the response time of the filter. While response delays occur in all conventional filter designs, they are of particular concern for high Q, narrow band-pass filters which typically include more and/or larger components which require longer charging times. Thus, it has been generally recognized that, as the band-pass for a filter is narrowed and its Q is increased, the response delay for that filter increases. Thus, the design of a filter capable of passing an increasingly narrow frequency band while maintaining an acceptable response delay characteristic has remained problematic.

Turning to FIG. 1a, a response characteristic 10 for a conventional narrow band-pass filter (not shown) may now be seen. As may now be seen, the narrow band-pass filter is tuned to frequency $f_C$. As the input signal sweeps through a range of frequencies, the amplitude of the response characteristic will start at zero, gradually increase, peak at center frequency $f_C$ and then gradually decrease back to zero. FIG. 1b illustrates the response delay which occurs in the narrow band-pass filter having the response characteristic illustrated in FIG. 1a in response to the application of a signal having frequency $f_C$ to an input side thereof. At time $t_0$, both the input signal 12 applied to the narrow band-pass filter and the output signal 14 produced by the response characteristic of the narrow band-pass filter are at zero. At time $t_2$, a burst which lasts until time $t_4$, is applied to the input side of the narrow band-pass filter. If the narrow band-pass filter had an ideal, i.e., 0 sec., response delay, the output signal 14 resulting from applying the response characteristic 10 to the input signal 12, would also appear at time $t_1$. However, the narrow band-pass filter will remain inactive for a latency period 16 which extends from the application of the input signal at time $t_1$ to time $t_3$. During the latency period 16, the narrow band-pass filter is storing current in a start-up resonant mode. From time $t_1$ to time $t_2$, no output signal passes through the narrow band-pass filter. As the burst continues past time $t_2$, energy begins to build in the form of a resonance. Accordingly, an output signal begins to build at the output of the narrow band-pass filter. When the level of the output signal reaches the average signal level of the input signal at time $t_3$, the latency period 16 ends and a stimulation period 18 begins.

A similar delay in the response of the narrow band-pass filter occurs upon removal of the input signal. 12. At time $t_4$, the input signal 12 applied to the input side of the narrow band-pass filter is removed. Upon removal of the input signal 12, the output signal 14 will continue at full strength for a short time period, i.e., until time $t_5$, and then begin to taper off to until returning to zero at time $t_6$.

It should be readily understood that there would be innumerable advantages for implementing a "real-time" narrow band-pass filter, i.e., a narrow band-pass filter having a response characteristic enhanced by the reduction or elimination of the response delay. Such a filter would have innumerable applications in industry. For example, as a filter having little or no response delay would be able to extract a desired signal from a relatively short signal burst, resolution of the desired signal on a cycle-by-cycle basis becomes possible. Currently, however, no real-time implementation of a narrow band-pass filter characterized by little or no response delay are known. It is noted that several non-real-time solutions to the problems caused by the response delay of filters have been proposed. Such solutions generally involve sampling the input signal and performing a mathematical analysis of the data in the frequency domain. While such techniques can resolve very short signal bursts occurring at a specific frequency, the computational time required can be rather significant. Thus, non-real-time solutions are not particularly suited for most filter applications.

What is needed, therefore, is a band-pass filter having a narrow pass response characteristic similar to existing high Q band-pass filters but avoids the response delay of such filters.

SUMMARY OF THE INVENTION

The present invention, accordingly, provides a narrow band-pass filter having a response delay which has been sufficiently reduced such that an input signal may be resolved on a cycle-by-cycle basis. The response delay of the narrow band-pass filter is generally equal to the time period required for a signal having a frequency which matches a pass frequency for the filter to oscillate through one-half of one cycle. Thus, for input signals in the range of 100KHz to 0.75GHZ, the response delay would be on the order of about 10 µseconds down to about 1 nanosecond. This compares quite favorably to existing high Q narrow band-pass filters which, depending on the particular design thereof, are generally characterized by response delays in the range of 100 µseconds to 2 milliseconds.

In a preferred embodiment thereof, the present invention is of a band pass filter which produces a filtered output signal in response to receipt of an input signal. The filter is comprised of an inverting amplifier, which may be an operational amplifier having an amplifying input to which the input signal is applied, an inverting input and an output on which the output signal is placed. Coupled between the output and the inverting input of the inverting amplifier is a signal processing circuit which has a characteristic which generally approximates the shape of a comb filter, i.e., the signal has a generally constant unity level with frequency except for a null at a pass frequency (and multiples thereof). As the inversion of the signal produced by the signal processing circuit is the response characteristic of the filter and the amplitude thereof is less than the amplitude of the input signal, the inverting amplifier passes the input signal whenever the frequency of the input signal matches the pass frequency of the filter, i.e., wherever the signal applied to the inverting input of the inverting amplifier is at the null. If, however, the frequency of the input signal is other than the pass frequency of the filter or a multiple thereof, the amplitude of the signal processing circuit signal applied to the inverting input is equal to but out of phase with the input signal. Accordingly, the output of the inverting amplifier is driven to an inversion of the signal applied to the inverting input, i.e., a generally equal but inverted output.

In alternate aspects thereof, the signal processing circuit may include a phase shift circuit which shifts the input signal by 180 degrees or a time delay circuit which delays the input signal by a time period generally equal to the period required for the input signal to oscillate through one-half of a cycle, i.e., ½λ. For both of these aspects, the shifted signal is combined with the input signal to produce the signal to be applied to the inverting input of the inverting amplifier and, in either of these aspects, the signal processing circuit may further include a power splitter circuit which replicates the input signal as a second signal to be passed through the shift circuit and/or a summer circuit for combining the input signal with the shifted signal. Of course, passive techniques may be used to separate and/or combine the aforementioned signals.

BRIEF DESCRIPTION OF THE DRAWINGS

FIG. 1b is a graphical illustration of a response delay for the narrow band-pass filter having the response characteristic illustrated in FIG. 1a;

FIG. 2c is a graphical illustration of a response characteristic for the narrow band-pass filter of FIG. 2a;

FIG. 3a is a block diagram of a first, preferred, configuration of the signal processing circuit of FIG. 2a;

FIG. 3b is a block diagram of a second, alternate, configuration of the signal processing circuit of FIG. 2a;

FIG. 4a is a specific embodiment of the narrow band-pass filter of FIG. 2a having a signal processing circuit configured in accordance with the circuit of FIG. 3a.

DETAILED DESCRIPTION OF THE PREFERRED EMBODIMENTS

Figure 1A:
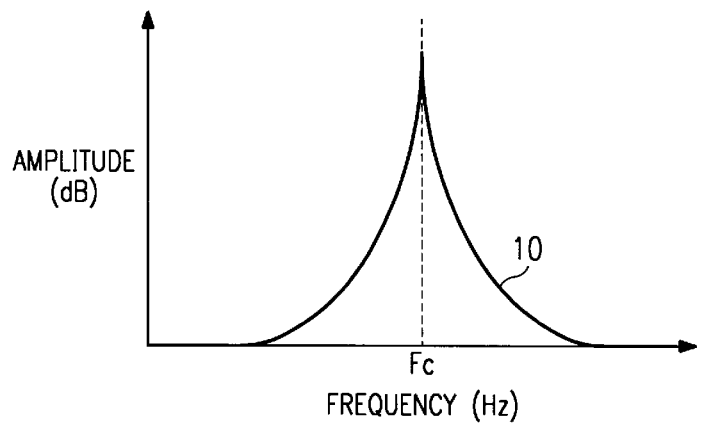
FIG. 1a is a graphical illustration of a frequency domain response characteristic for a conventional high Q narrow band-pass filter.
Figure 1B:
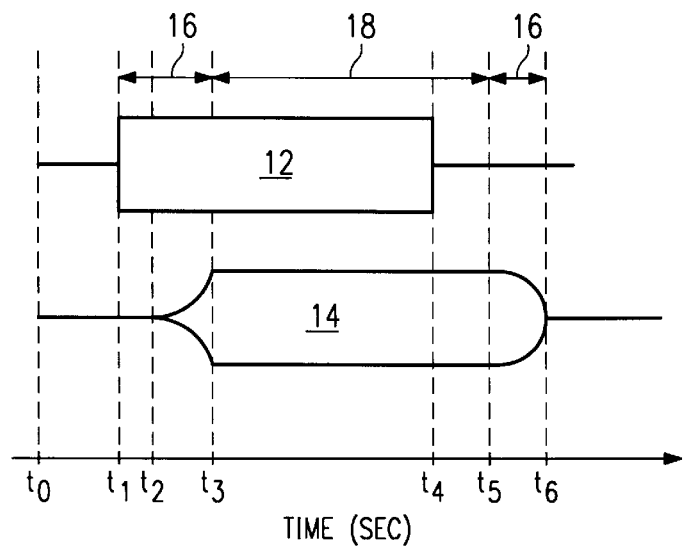
Figure 2A:
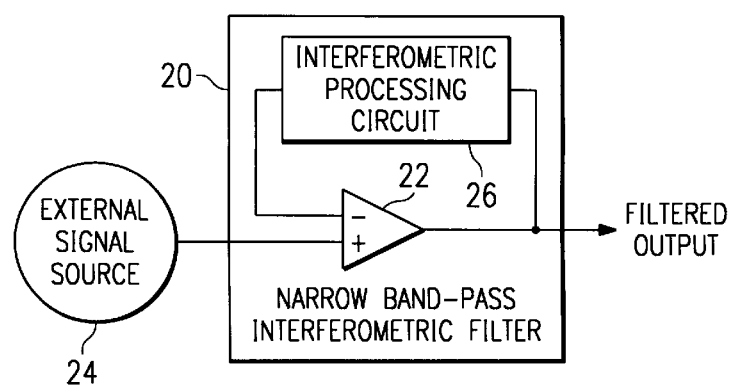
FIG. 2a is a block diagram of a narrow band-pass filter constructed in accordance with the teachings of the present invention.

Turning now to FIG. 2a, a narrow band-pass interferometric filter 20 which is constructed in accordance with the teachings of the present invention will now be described in greater detail. In the field of optics, the term "interferometer" generally refers to any arrangement whereby a beam of light is separated into two or more parts and then are subsequently reunited after traversing different optical paths. Heretofore, the application of such technologies to electrical circuits is unknown. Accordingly, as used herein, the term "interferometric filter" is hereby defined to encompass all filters comprised of an electrical network which includes a signal processing circuit and/or signal processing technique which includes the steps of separating a electrical signal into two parts, propagating the two signals along different paths and then recombining the signals.

As may now be see, the narrow band-pass interferometric filter 20 is comprised of an inverting amplifier 22 which may be an operational amplifier, having an amplifying input tied to an external signal source 24 which provides an input signal to be filtered, an inverting input which is tied to a feedback loop for the inverting amplifier 22 and an output on which the output signal is placed after filtering. Provided along the feedback loop for the inverting amplifier 22 is a signal processing circuit, hereafter referred to as interferometric processing circuit 26, the configuration of which will be more fully described below. Broadly speaking, however, the interferometric processing circuit 26, in effect, operates to cancel certain selected frequencies from the input signal provided by the external signal source 24.

The external signal source 24 may be, for example, a modulated data signal received from a master transceiver of a bi-directional data transmission system such as that disclosed in U.S. patent application Ser. Nos. 08/955,326 (Atty. Docket No. 10393.10), 08/955,482 (Atty. Docket No. 10393.11), 08/956,244 (Atty. Docket No. 10393.12), 08/956,244 (Atty. Docket No. 10393.19, all of which were filed on even date herewith and previously incorporated by reference as if reproduced in their entirety. Of course, the disclosure of the external signal source 24 as being a master transceiver which provides a modulated data signal is purely exemplary and it is specifically contemplated that the external signal source 24 encompasses a wide variety of electrical devices and other sources capable of generating a signal, the filtering of which would be desirable.

A signal produced by the external voltage source 24 is provided to the amplifying input of the inverting amplifier 22. The signal passes to the feedback loop of the inverting amplifier 22. As will be more fully described below, the signal processing circuit 26 splits the signal into two identical signals. One of the two signals is temporally shifted by a preselected amount. In accordance with alternate aspects of the invention, the shift may be accomplished by way of a phase shifter which physically shifts the phase of the signal or by way of a time delay circuit where, by delaying the arrival of the signal by a preselected time period, the signal is, in effect, shifted by a preselected amount, relative to the unmanipulated signal. The two signals are then combined into a single signal. The two signals may be combined passively, for example, by coupling the two paths to a common output node, for example, node 44 of FIG. 3a, or, if desired, by use of a summing circuit, for example, summing circuit 50 of FIG. 3b. The combined signal is then applied to the inverting input of the inverting amplifier 22. By doing so, the inverting amplifier 22 will operate in a fashion similar to a filter—passing the input signal when the frequency thereof is at certain pass frequencies but providing a unity output whenever the input signal is outside the pass frequencies.

Figure 2B:
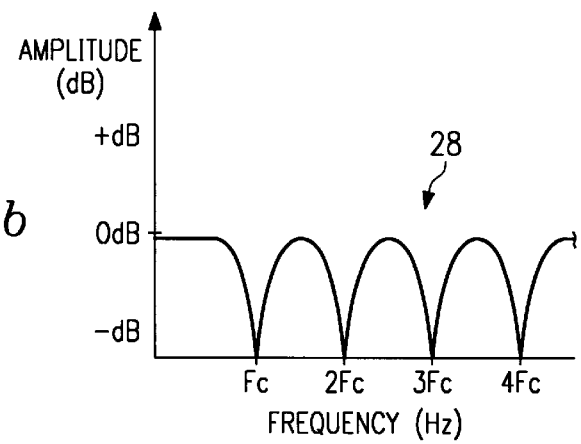
FIG. 2b is a graphical illustration of a signal, produced by a signal processing circuit of the narrow band-pass filter of FIG. 2a, to be applied to an inverting input of an inverting amplifier thereof.
Figure 2C:
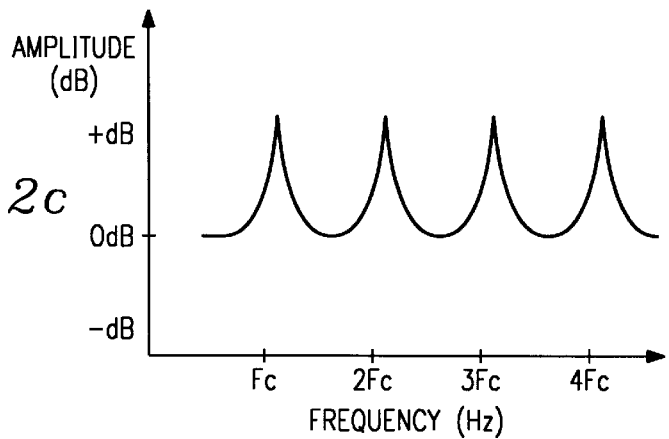

Referring next, in combination, to FIGS. 2a–c, the operation of the narrow band-pass interferometric filter 20 shall now be described in greater detail. First, the frequencies to be passed by the narrow band-pass interferometric filter 20 should be selected and the narrow band-pass interferometric filter 20 tuned to pass the selected frequencies. For example, if the external signal is the aforementioned modulated data signal, it may be desirable to filter the external signal such that only that portion of the signal which is at the carrier frequency $F_C$ (or multiples thereof) will pass the narrow band-pass interferometric filter 20. By doing so, the carrier frequency may be extracted from the received modulated data signal. To tune the narrow band-pass interferometric filter 20 to pass only selected frequencies of the input signal provided by the external signal source 24, for example, to only pass multiples of the carrier frequency $F_C$, the interferometric processing circuit 26 is adjusted such that, when producing a signal by combining the signal input thereto with a shifted signal generated thereby, the produced signal will have a null at the selected pass frequencies, here, the carrier frequency $F_C$ and multiples thereof. It is contemplated that the nulls may be produced using a variety of techniques. One such technique involves a shift, of the signal to be shifted by the interferometric processing circuit 26, relative to the pass frequency $F_C$, by 180 degrees prior to combination of the shifted signal with the original signal. By doing so, the signal produced by the interferometric processing circuit 26 will have nulls at the pass frequency $F_C$ and all multiples thereof.

After tuning the narrow band-pass interferometric filter 20 appropriately, the unfiltered input signal produced by the external signal source 24 to be filtered by the narrow band-pass interferometric filter 20 is applied to the input side thereof. As the input signal may be at any frequency within an operating range, for purposes of this discussion, it is presumed that input signal is a series of sinusoidal signals, each at a distinct frequency, which collectively comprise a selected frequency spectrum. As the input signal is applied to the amplifying input of the inverting amplifier 22, the input signal is passed to the interferometric processing circuit 26.

Within the interferometric processing circuit 26, the input signal would first be split into two identical signals. One of the two would be left unchanged while the other would be shifted by ½λ of the previously selected pass frequency $F_C$. The two signals would then be combined. The signal resulting from the aforementioned processing steps may be seen by reference to FIG. 2b. As may now be seen, the resultant waveform 28 has nulls located at the selected pass frequency $F_C$ (and its multiples) and a generally constant amplitude outside of the pass frequencies. Thus, the resultant waveform 28 is shaped to closely resemble the response characteristic of a comb filter.

The interferometric processing circuit 26 produces the waveform 28 because, regardless of the frequency of a particular portion of the input signal, the interferometric processing circuit 26 shifts that signal by ½λ for $F_C$. Thus, whenever the frequency of the input signal matches a multiple of $F_C$, the shifted signal is exactly 180 degrees out of phase with the original signal. When the two are combined, therefore, the two cancel. If, however, the frequency of the input signal is other than $F_C$, the two signals would not cancel when combined. Of course, FIG. 2b shows an ideal representation of the waveform 28. Because of the difficulty in precisely shifting a signal, as well as other physical factors such as signal attenuation, physical implementations of the interferometric processing circuit 26 would produce a waveform which, while having distinct nulls at the appropriate frequencies, the nulls would have some amplitude. Additionally, outside the nulls, the amplitude of the response would gradually lessen as the frequency increases.

The waveform 28 produced by the interferometric processing circuit 26 is then fed to the inverting input of the inverting amplifier 22. When the frequency of the input signal provided by the external signal source 24 matches one of the pass frequencies, the output of the signal processing circuit 26 is at a null. Accordingly, the input signal passes through the inverting amplifier 22 and is amplified by the open loop gain of the inverting amplifier 22. If, however, the frequency of the input signal provided by the external signal source is outside of the pass frequencies corresponding to the nulls and since the amplitude of the waveform 28 outside of the nulls is the same as that of the input signal provided by the external signal source 24, the output of the inverting amplifier 22 is driven to operate in the inverting unity gain mode, which by proper selection of the input and feedback resistors (not shown) of the inverting amplifier 22 can be set to unity gain. FIG. 2c illustrates a response characteristic 30 for the narrow band-pass interferometric filter 20. The response characteristic 30 is produced by inverting the waveform 28 fed to the inverting input of the inverting amplifier 22. Accordingly, upon application of the signal produced by the external signal source 24 to the input of the narrow band-pass interferometric filter 20, signals at the pass frequency $F_C$, (and multiples thereof) pass with amplification while signals at other frequencies are not amplified.

Figure 3A:
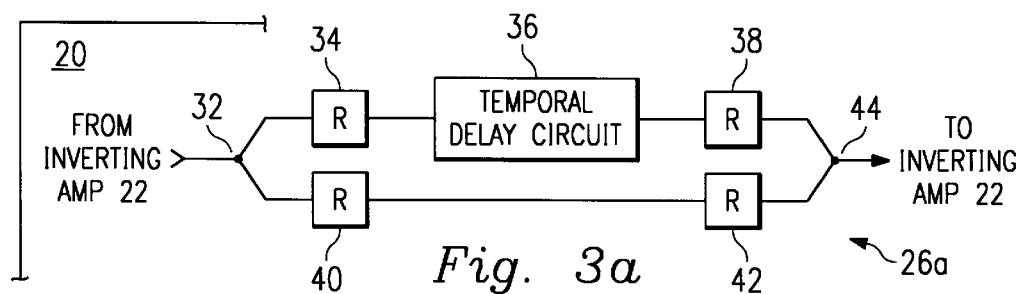
Figure 3B:
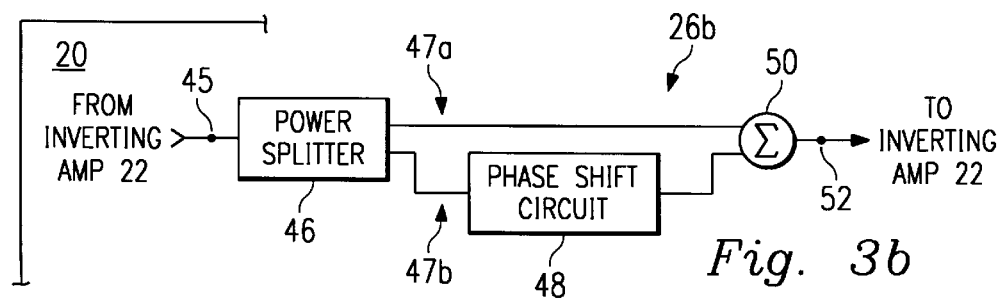

Turning next to FIG. 3a, a first configuration of the interferometric processing circuit 26, hereafter referred to as interferometric processing circuit 26a, may now be seen. In this configuration, a time delay is used to cancel those portions of the waveform 28 at the selected pass frequency $F_C$ (and multiples thereof).

As may now be seen, the interferometric processing circuit 26a includes an input node 32 coupled to the output terminal of the inverting amplifier 22 and an output node 44 coupled to the inverting input of the inverting amplifier 22. The signal processing circuit 26a further includes a first signal path which starts at the input node 32 and extends through resistors 40 and 42 and ends at the output node 44 and a second signal path which starts at the input node 32, extends through resistor 34, temporal delay circuit 36 and resistor 38 and ends at the output node 44. At the input node 32, the input signal applied to the inverting amplifier 22 by the external signal source 24 will split into first and second signals, both of which are preferably identical to the input signal. The temporal delay circuit 36 delays the second signal traveling along the second path such that it arrives at the output node 42 at a preselected time period after the arrival of the first signal thereat. The time delay to be caused by the temporal delay circuit 36 is set to be approximately equal to ½λ of the frequency $F_C$ to which the narrow band-pass interferometric filter 20 is tuned. For example, if the filter 20 is tuned to pass signals at a frequency of 15 MHz, the temporal delay circuit 36 would be set to delay the arrival of the second signal at the output node 44 by 66.67 nanoseconds. The resistors 34, 38, 40 and 42 are selected to adjust the amplitudes of the first and second signals to remove any differences caused by signal attenuation, particularly within the temporal delay circuit 36. These resistors are also selected, in conjunction with the selection of other resistors of the narrow band-pass filter 20 to eliminate possible standing waves due to impedance mismatches of the cable.

It should be noted that the first and second signal paths are directly connected at both the input and the output nodes 32 and 44. As a result, therefore, the input signal passively separates into the first and second signals at the input node 32. Similarly, the first and second signals passively combine into the output signal at the output node 44. If desired, however, a power splitter such as power splitter 46 of FIG. 3b may be used to separate the input signal into the first and second signals and a summing circuit such as summing circuit 50 of FIG. 3b may be used to combine the first and second signals into the output signal. For example, depending on the specific configuration of the narrow band-pass filter 20, it may be necessary to use a power splitter to avoid adverse division effects to the input signal.

Figure 4A:
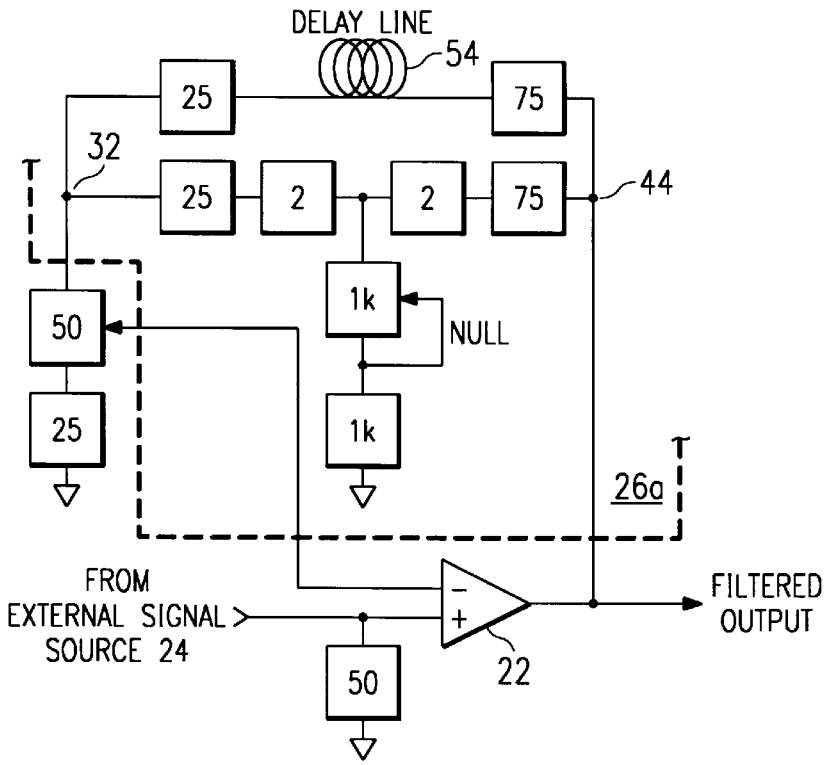

Referring next to FIG. 4a, a specific configuration of the narrow band-pass interferometric filter 20 comprised of the inverting amplifier 22 having the interferometric processing circuit 26a provided in the feedback loop thereof may now be seen. In this configuration, the temporal delay circuit 36 has been implemented by use of a delay line 54, alternately, a coil of electrical cable or a wire or trace on a printed circuit board or integrated circuit which, when placed in the second signal path causes the length of the second signal path to be many times greater than the length of the first signal path. Generally, while an electrical signal is generally assumed to instantaneously propagate along an electrical cable, electrical signals travel at a velocity which will tends to vary based upon certain characteristics of the cable. In many such cables, an electrical signal takes between 1.1 and 1.5 nanoseconds to travel each foot of distance. Using this characteristic of cable, the arrival of the second signal at the output node 44 may be delayed a preselected selected time period relative to the first signal and, by adjusting the time delay by adjusting the cable length for the second signal path, the narrow band-pass interferometric filter may be tuned to a selected wavelength.

For example, if a carrier frequency of a modulated data signal is 15 MHz, the narrow band-pass interferometric filter 20 must be tuned to 15 MHz in order to extract the carrier from the remainder of the signal. To tune the narrow band-pass interferometric filter 20 to 15 MHz, the second signal will need to be delayed ½ relative to the first signal. This corresponds to a delay of approximately 33.5 nanoseconds (0.5(1 cycle/15,000,000 cycles per second)). Assuming that the selected cable has a delay characteristic of 1.5 nanoseconds/foot, the delay line 54 should have a length of about 22.3 feet. As previously stated, the narrow band-pass interferometric filter 20 should be tunable to enable adjustment of the pass frequency. As it is necessary for the arrival time of the signal propagating along the second path at the output node 44 to be delayed by ½λ relative to the signal propagating along the first path and as the temporal delay circuit 36 which performs the aforementioned delay is implemented as a coil of electrical cable having a length selected based upon its delay characteristic and the desired time delay, the filter 20 may be tuned by varying the length of the coil of electrical cable. It is contemplated that adjustment of the length of the coil may be accomplished in a variety of ways. For example, a series of taps may be provided along the electrical cable or trace such that the length of the second signal path may be shortened or lengthened by coupling an appropriate tap or the addition of devices, conductors, or semi-conductors with specified propagation delay may be employed to the output node 44.

Turning next to FIG. 3a, a second configuration of the interferometric processing circuit 26, hereafter referred to as interferometric processing circuit 26b, may now be seen. In this configuration, a phase shift is used to cancel those portions of the waveform 28 at the selected pass frequency $F_C$ (and multiples thereof). As before, since the interferometric processing circuit 26b also performs the steps of separating the input signal into first and second signals, respectively propagating the first and second two signals along first and second signal paths and then recombining the first and second signals to produce the output signal, a filter which includes the interferometric processing circuit 26b should also be considered to be an interferometric filter.

As may now be seen, the interferometric processing circuit 26b includes an input node 45 coupled to the output terminal of the inverting amplifier 22 and an output node 52 coupled to the inverting input of the inverting amplifier 22. Coupled to the input node 45 is a power splitter 46 which separates the input signal into the first and second signals, both of which are identical to the input signal. From the output of the power splitter 46, the first and second signals respectively propagate along first and second paths 47a and 47b to a summer circuit 50. As may be further seen in FIG. 3b, the second path 47b extends through a phase shift circuit 48 which shifts the phase of the second signal by 180 degrees. The first signal is then combined with the phase shifted second signal by the summer circuit 50 to form the output signal which is propagated to the inverting input of the inverting amplifier 22. Of course, it is contemplated that one or both of the power splitter 46 and/or the summer circuit 50 may be omitted from the interferometric processing circuit 26b if passive separation and recombination techniques are desired.

Figure 4B:
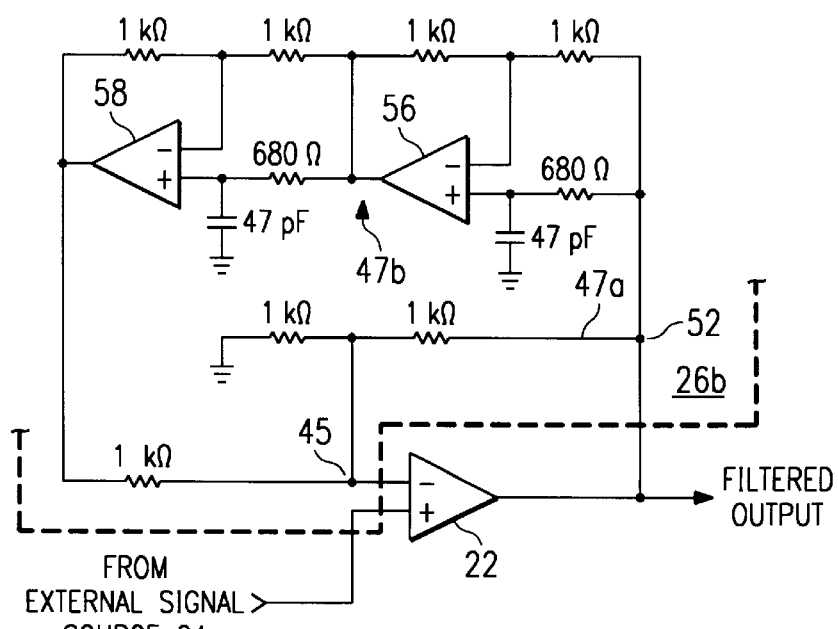
FIG. 4b is a specific embodiment of the narrow band-pass filter of FIG. 2a having a signal processing circuit configured in accordance with the circuit of FIG. 3b.

Referring next to FIG. 4b, a specific configuration of the narrow band-pass interferometric filter 20 comprised of the inverting amplifier 22 having the interferometric processing circuit 26b provided in the feedback loop thereof may now be seen. In this configuration, the phase shift circuit 48 which is provided along the second path 47b has been implemented by use of first and second inverting amplifiers 56 and 58 arranged in a two-stage configuration.

Although illustrative embodiments of the invention have been shown and described, other modifications, changes, and substitutions are intended in the foregoing disclosure. For example, the invention is equally suitable for use in a wide variety of filter applications other than those specifically disclosed herein. Accordingly, it is appropriate that the appended claims be construed broadly and in a manner consistent with the scope of the invention.

What is claimed is:

1. A band-pass filter having a pass frequency, said band-pass filter producing a filtered output signal at an output line in response to receipt of an input signal, said band-pass filter comprising:

an input line for receiving said input signal;

an inverting amplifier having an output terminal coupled to said output line, an non-inverting terminal coupled to said input line and an inverting terminal; and a signal processing circuit having an input coupled to said output terminal and an output coupled to said inverting terminal, said signal processing circuit combining said filtered output signal and a second signal produced by shifting said filtered output signal to produce an output signal having a null at said pass frequency of said band-pass filter and a generally constant amplitude outside said pass frequency;

said inverting amplifier producing said filtered output signal by passing said input signal with amplification whenever said output signal produced by said signal processing circuit is at said null and passing said input signal without amplification whenever said output signal produced by said signal processing circuit is outside said null.

2. A band-pass filter having a pass frequency, said band-pass filter producing a filtered output signal at an output line in response to receipt of an input signal, said band-pass filter comprising:

an input line for receiving said input signal;

an inverting amplifier having an output terminal coupled to said output line, an non-inverting terminal coupled to said input line and an inverting terminal;

a signal processing circuit having an input coupled to said output terminal and an output coupled to said inverting terminal, said signal processing circuit combining said filtered output signal and a second signal produced by shifting said filtered output signal to produce an output signal having a null at said pass frequency of said band-pass filter and a generally constant amplitude outside said pass frequency;

said inverting amplifier producing said filtered output signal by passing said input signal with amplification whenever said output signal produced by said signal processing circuit is at said null and passing said input signal without amplification whenever said output signal produced by said signal processing circuit is outside said null;

wherein said signal processing circuit further comprises:

a first signal path, coupled between said input and said output of said signal processing circuit, for transmitting said input signal therebetween;

a second signal path, coupled between said input and said output of said signal processing circuit, for transmitting said input signal therebetween;

a phase shift circuit connected along said second signal path, said phase shift circuit shifting said input signal transmitted along said second signal path by ½λ.

3. A band-pass filter according to claim 2 wherein said signal processing circuit further comprises:

a power splitter having an input coupled to said input of said signal processing circuit, a first output coupled to said first signal path and a second output coupled to said second signal path;

said power splitter replicating said input signal for transmission along both of said first signal path and said second signal path.

4. A band-pass filter according to claim 3 wherein signal processing circuit further comprises:

a summing circuit having a first input coupled to said first signal path, a second input coupled to said second signal path and an output coupled to said output of said signal processing circuit;

said summing circuit combining said input signal and said phase shifted input signal into a summed signal and providing said summed signal as said output of said signal processing circuit.

5. A band-pass filter according to claim 4 wherein said band-pass filter is an interferometric filter.

6. A band-pass filter having a pass frequency, said band-pass filter producing a filtered output signal at an output line in response to receipt of an input signal, said band-pass filter comprising:

an input line for receiving said input signal;

an inverting amplifier having an output terminal coupled to said output line, an non-inverting terminal coupled to said input line and an inverting terminal;

a signal processing circuit having an input coupled to said output terminal and an output coupled to said inverting terminal, said signal processing circuit combining said filtered output signal and a second signal produced by shifting said filtered output signal to produce an output signal having a null at said pass frequency of said band-pass filter and a generally constant amplitude outside said pass frequency;

said inverting amplifier producing said filtered output signal by passing said input signal with amplification whenever said output signal produced by said signal processing circuit is at said null and passing said input signal without amplification whenever said output signal produced by said signal processing circuit is outside said null;

wherein said signal processing circuit further comprises:

a first signal path, coupled between said input and said output of said signal processing circuit, for transmitting said input signal therebetween;

a second signal path, coupled between said input and said output of said signal processing circuit, for transmitting said input signal therebetween;

a time delay circuit connected along said second signal path, said time delay circuit delaying arrival of said input signal transmitted along said second signal path by a preselected time delay period.

7. A band-pass filter according to claim 6 wherein said band-pass filter is an interferometric filter.

8. A band-pass filter according to claim 7 wherein said preselected time delay period is equal to the reciprocal of said pass frequency.

9. A band-pass filter according to claim 7 wherein said time delay circuit is comprised of a coil of wire having a length selected based upon a propagation delay characteristic of said wire and said preselected time delay period.

10. A band-pass filter according to claim 9 wherein said signal processing circuit further comprises:

a power splitter having an input coupled to said input of said signal processing circuit, a first output coupled to said first signal path and a second output coupled to said second signal path;

said power splitter replicating said input signal for transmission along both of said first signal path and said second signal path.

11. A band-pass filter according to claim 10 wherein signal processing circuit further comprises:

a summing circuit having a first input coupled to said first signal path, a second input coupled to said second signal path and an output coupled to said output of said signal processing circuit;

said summing circuit combining said input signal and said phase shifted input signal into a summed signal and providing said summed signal as said output of said signal processing circuit.

12. An interferometric band-pass filter having a pass frequency, said interferometric band-pass filter producing a filtered output signal, said band-pass filter comprising:

an inverting amplifier having an output line, a non-inverting input connected to receive an input signal from a signal source and an inverting input tied to said output line via a feedback loop;

said feedback loop including a circuit which combines said input signal and a second signal produced by shifting said input signal by a preselected wavelength to produce a feedback loop output signal, said feedback loop output signal having a null at said pass frequency of said band-pass filter and a generally constant amplitude outside said pass frequency.

13. An interferometric band-pass filter according to claim 12 wherein said combining circuit of said feedback loop further comprises:

an input node coupled to said output line of said inverting amplifier;

an output node coupled to said inverting input of said inverting amplifier;

first and second signal paths, each respectively connecting said input and output nodes;

said second signal path including a time delay circuit which shifts said input signal by delaying arrival of said input signal by a preselected time period.

14. An interferometric band-pass filter according to claim 13 wherein said time delay circuit is comprised of a coil of wire having a length selected based upon a propagation delay characteristic of said wire and said preselected time period.

15. A method for filtering a signal, comprising the steps of:

receiving a signal to be filtered at a non-inverting input of an operational amplifier;

generating a shifted signal by shifting a filtered output signal of said operational amplifier by a predetermined wavelength:

combining said filtered output signal and said shifted signal to produce a combined signal having a null at a pass frequency and a generally constant amplitude outside said pass frequency and applying said combined signal to an inverting input of said operational amplifier; and generating said filtered output signal by passing said received signal with amplification whenever said combined signal is at said null and passing said received signal without amplification whenever said combined signal is outside said null.

* * * * *